(12) United States Patent
Furusho et al.

(10) Patent No.: US 9,994,684 B2
(45) Date of Patent: Jun. 12, 2018

(54) METHOD FOR FORMING BOND BETWEEN DIFFERENT ELEMENTS

(71) Applicant: NISSAN CHEMICAL INDUSTRIES, LTD., Tokyo (JP)

(72) Inventors: Hitoshi Furusho, Funabashi (JP); Yuki Nohara, Funabashi (JP); Hisayuki Watanabe, Toyama (JP); Yuichi Goto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days. days.

(21) Appl. No.: 14/691,214

(22) Filed: Apr. 20, 2015

(65) Prior Publication Data

US 2015/0252152 A1 Sep. 10, 2015

Related U.S. Application Data

(62) Division of application No. 13/518,712, filed as application No. PCT/JP2010/073255 on Dec. 23, 2010, now abandoned.

(30) Foreign Application Priority Data

Dec. 24, 2009 (JP) .................. 2009-292300

(51) Int. Cl.
*C08J 3/28* (2006.01)
*H01L 21/02* (2006.01)
(Continued)

(52) U.S. Cl.
CPC .............. *C08J 3/28* (2013.01); *B01J 19/081* (2013.01); *B01J 19/087* (2013.01);
(Continued)

(58) Field of Classification Search
CPC ........ C08J 3/28; C08J 2383/16; B01J 19/081; B01J 19/087; H01L 21/0242;
(Continued)

(56) References Cited

U.S. PATENT DOCUMENTS 4,382,099 A    5/1983  Legge et al.
5,753,886 A    5/1998  Iwamura et al.
(Continued)

FOREIGN PATENT DOCUMENTS

JP    H06-314660 A    11/1994
JP    2005-510085 A    4/2005
(Continued)

OTHER PUBLICATIONS

May 20, 2015 Office Action issued in Taiwanese Patent Application No. 099145807.
(Continued)

*Primary Examiner* — Xiuyu Tai
(74) *Attorney, Agent, or Firm* — Oliff PLC

(57) ABSTRACT

Described is a doping technique that forms a stable amorphous silicon film and a stable polycrystalline silicon film at a low temperature and simultaneously that imparts conductivity in an atmospheric pressure environment. A method for producing a compound containing a bond between different elements belonging to Group 4 to Group 15 of the periodic table, the method including: applying, at a low frequency and atmospheric pressure, high voltage to an inside of an electric discharge tube obtained by attaching high-voltage electrodes to a metal tube or an insulator tube or between flat plate electrodes while passing an introduction gas, so as to convert molecules present in the electric discharge tube or between the flat plate electrodes into a plasma; and applying
(Continued)

the plasma to substances to be irradiated, the substances to be irradiated being two or more elementary substances or compounds.

12 Claims, 8 Drawing Sheets

(51) Int. Cl.
| | |
|---|---|
| *H01L 21/225* | (2006.01) |
| *H01L 31/0288* | (2006.01) |
| *H01L 31/18* | (2006.01) |
| *H01L 31/20* | (2006.01) |
| *B01J 19/08* | (2006.01) |

(52) U.S. Cl.
CPC .... *H01L 21/0242* (2013.01); *H01L 21/02532* (2013.01); *H01L 21/02576* (2013.01); *H01L 21/02579* (2013.01); *H01L 21/02592* (2013.01); *H01L 21/02628* (2013.01); *H01L 21/2254* (2013.01); *H01L 31/0288* (2013.01); *H01L 31/182* (2013.01); *H01L 31/20* (2013.01); *C08J 2383/16* (2013.01); *H05H 2245/123* (2013.01); *Y02E 10/546* (2013.01); *Y02P 70/521* (2015.11)

(58) Field of Classification Search
CPC ......... H01L 21/02532; H01L 21/02576; H01L 21/02579; H01L 21/02592; H01L 21/02628; H01L 21/2254; H01L 31/0288; H01L 31/182; H01L 31/20; H01L 31/075; H01L 31/202; H01L 31/204; H01L 31/206; H01L 31/056; Y02P 70/521; H05H 2245/123; H05H 1/2406; H05H 2001/2412; H05H 2001/2462; Y02E 10/546; Y02E 10/548; Y02E 10/52; Y02E 10/542; H01G 9/2031; H01G 9/2059

See application file for complete search history.

(56) References Cited

U.S. PATENT DOCUMENTS

| | | | |
|---|---|---|---|
| 6,180,439 B1 | 1/2001 | Yamazaki et al. | |
| 6,225,152 B1 | 5/2001 | Yamazaki et al. | |
| 6,316,810 B1 | 11/2001 | Yamazaki et al. | |
| 6,465,287 B1 | 10/2002 | Yamazaki et al. | |
| 6,478,263 B1 | 11/2002 | Yamazaki et al. | |
| 6,504,174 B1 | 1/2003 | Yamazaki et al. | |
| 6,528,358 B1 | 3/2003 | Yamazaki et al. | |
| 6,528,820 B1 | 3/2003 | Yamazaki et al. | |
| 6,744,069 B1 | 6/2004 | Yamazaki et al. | |
| 7,037,811 B1 | 5/2006 | Yamazaki et al. | |
| 7,056,381 B1 | 6/2006 | Yamazaki et al. | |
| 2002/0016017 A1* | 2/2002 | Sakai | H01L 31/075 438/57 |
| 2003/0096490 A1 | 5/2003 | Borland et al. | |
| 2005/0016456 A1* | 1/2005 | Taguchi | H05H 1/2406 118/723 E |
| 2009/0162263 A1 | 6/2009 | Chang et al. | |

FOREIGN PATENT DOCUMENTS

| | | |
|---|---|---|
| JP | 2005-238204 A | 9/2005 |
| JP | 2005-260139 A | 9/2005 |
| JP | 2007-243216 A | 9/2007 |

OTHER PUBLICATIONS

Apr. 5, 2011 Written Opinion of the International Searching Authority issued in Application No. PCT/JP2010/073255.
Apr. 5, 2011 International Search Report issued in Application No. PCT/JP2010/073255.

* cited by examiner

[FIG. 1]
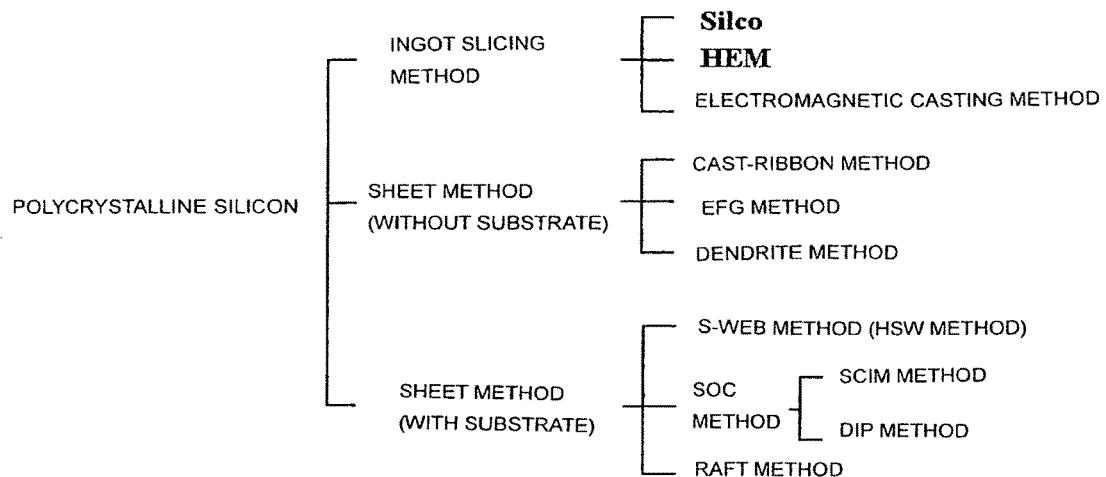
[FIG. 2]
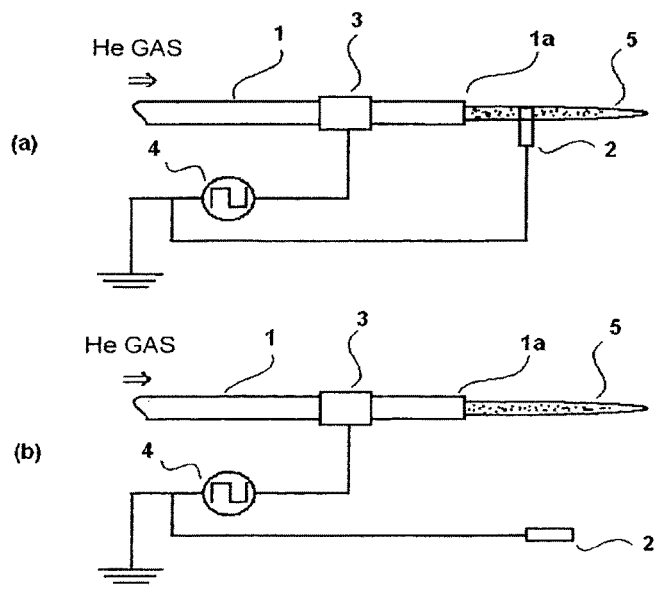

[FIG. 3]
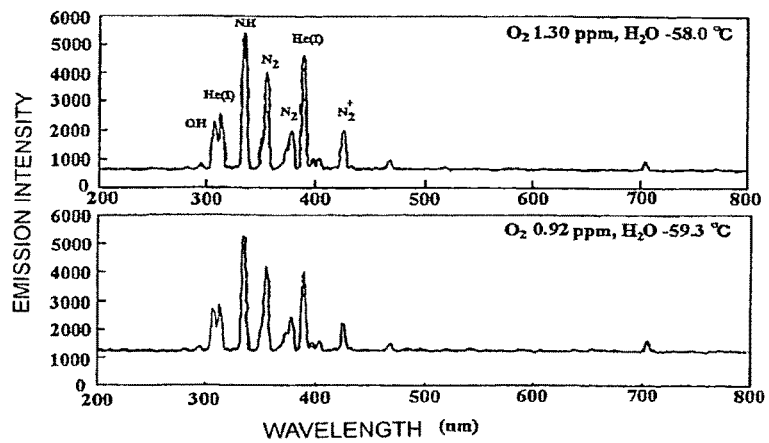
[FIG. 4]
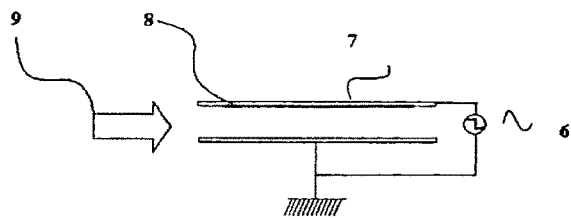
[FIG. 5]
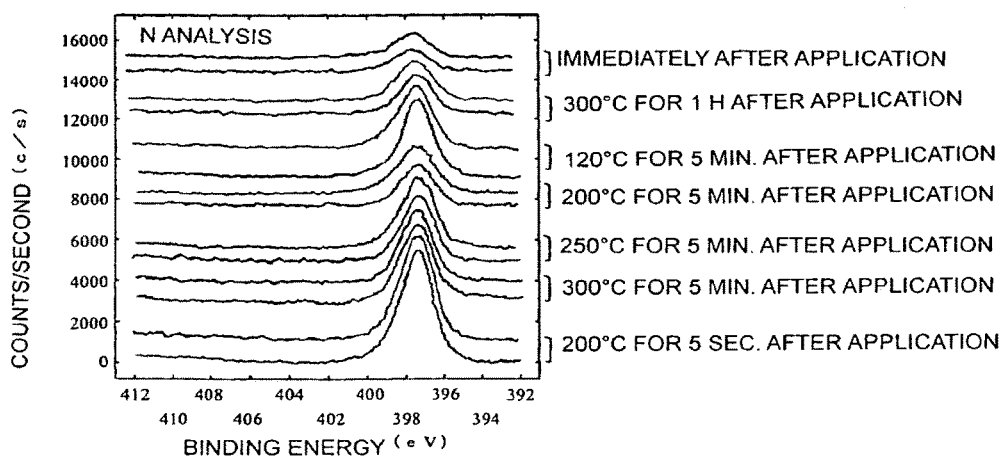

[FIG. 6]
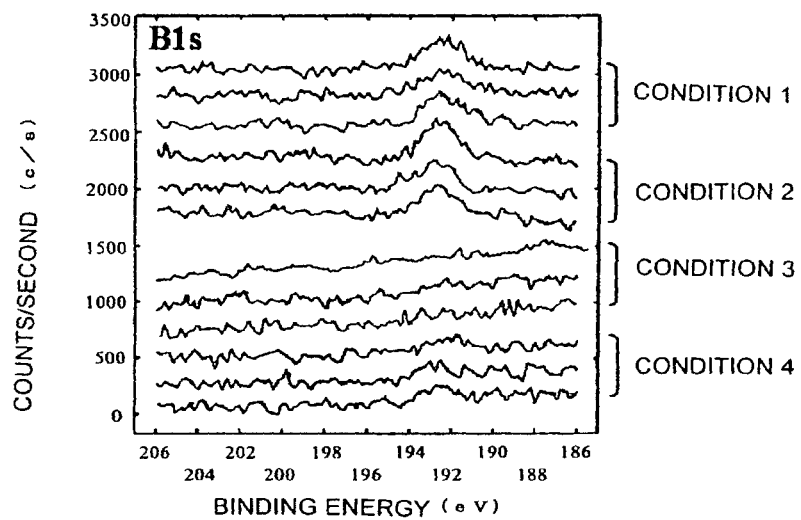
[FIG. 7]
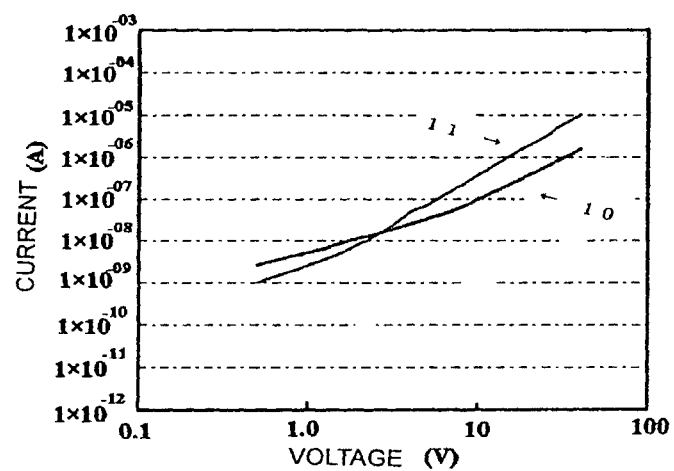

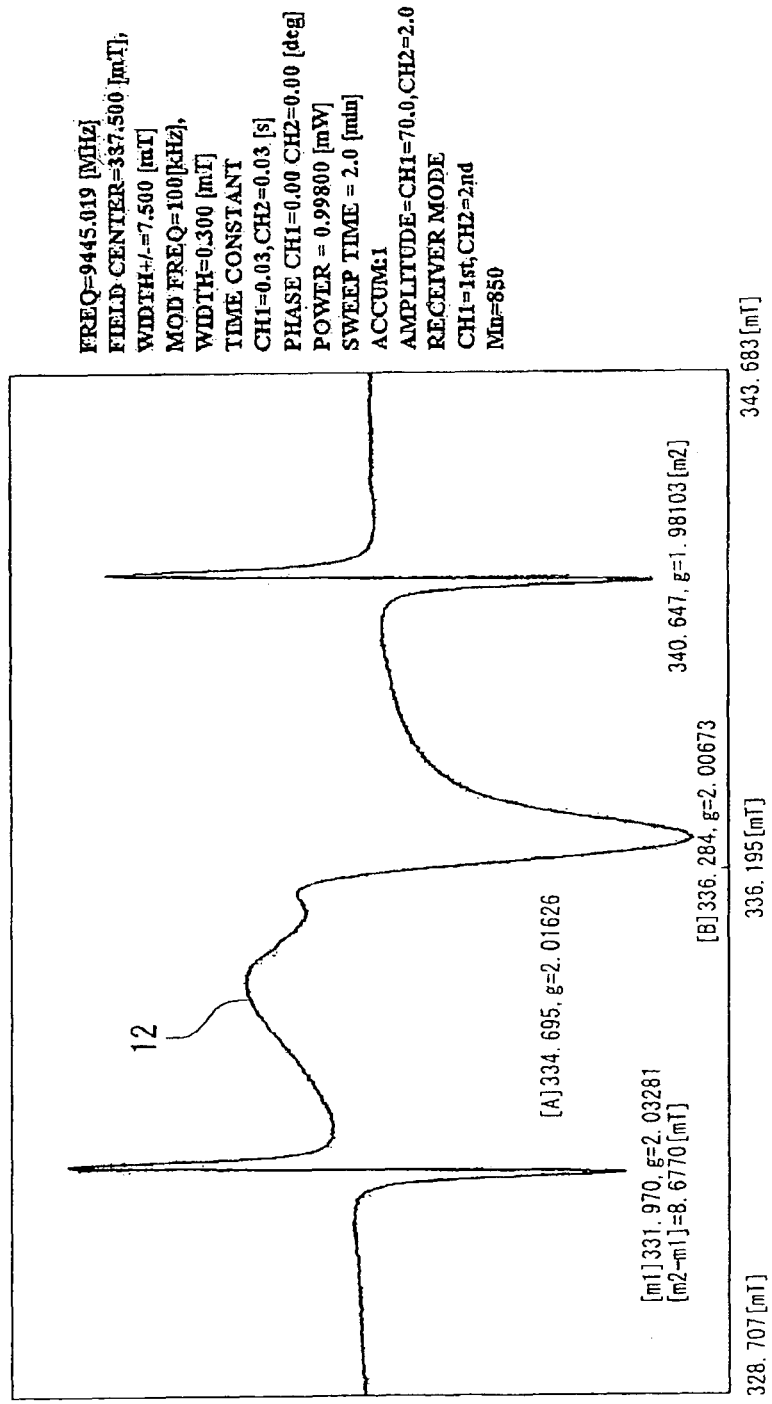
[FIG. 8]

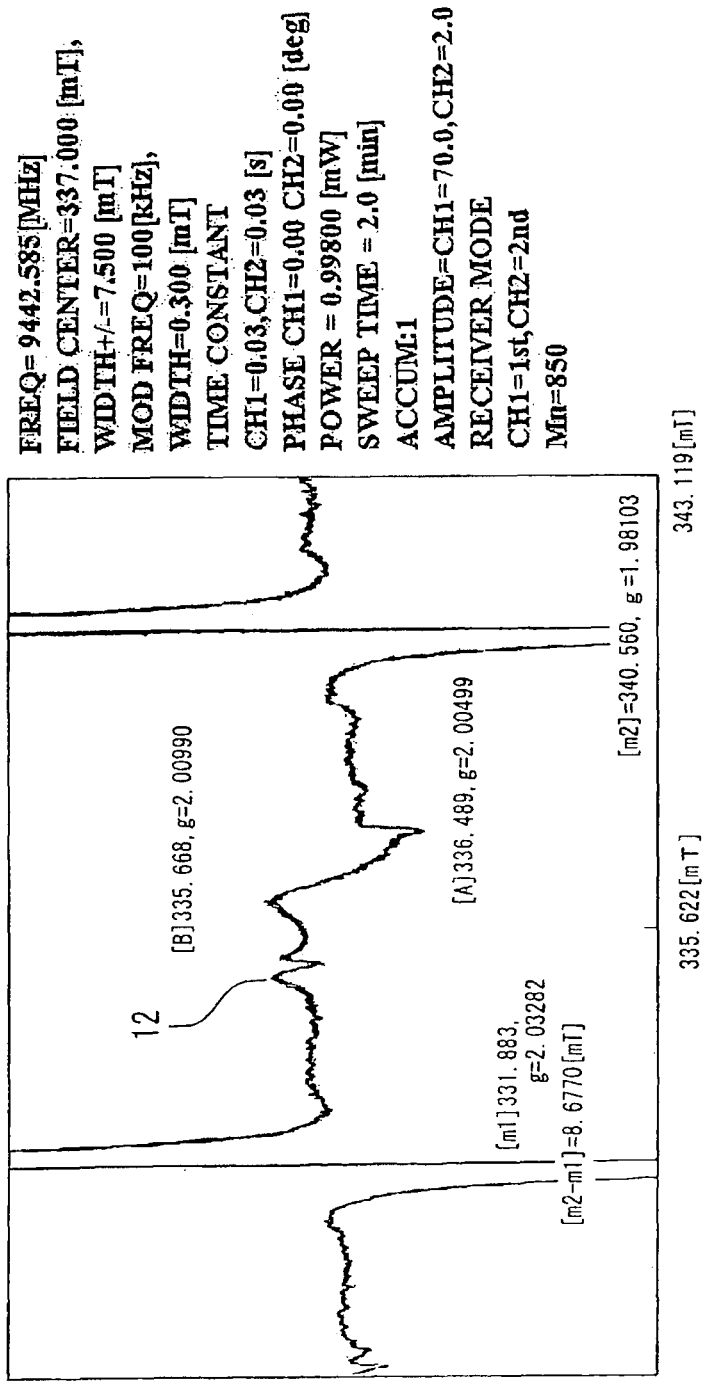
[FIG. 9]

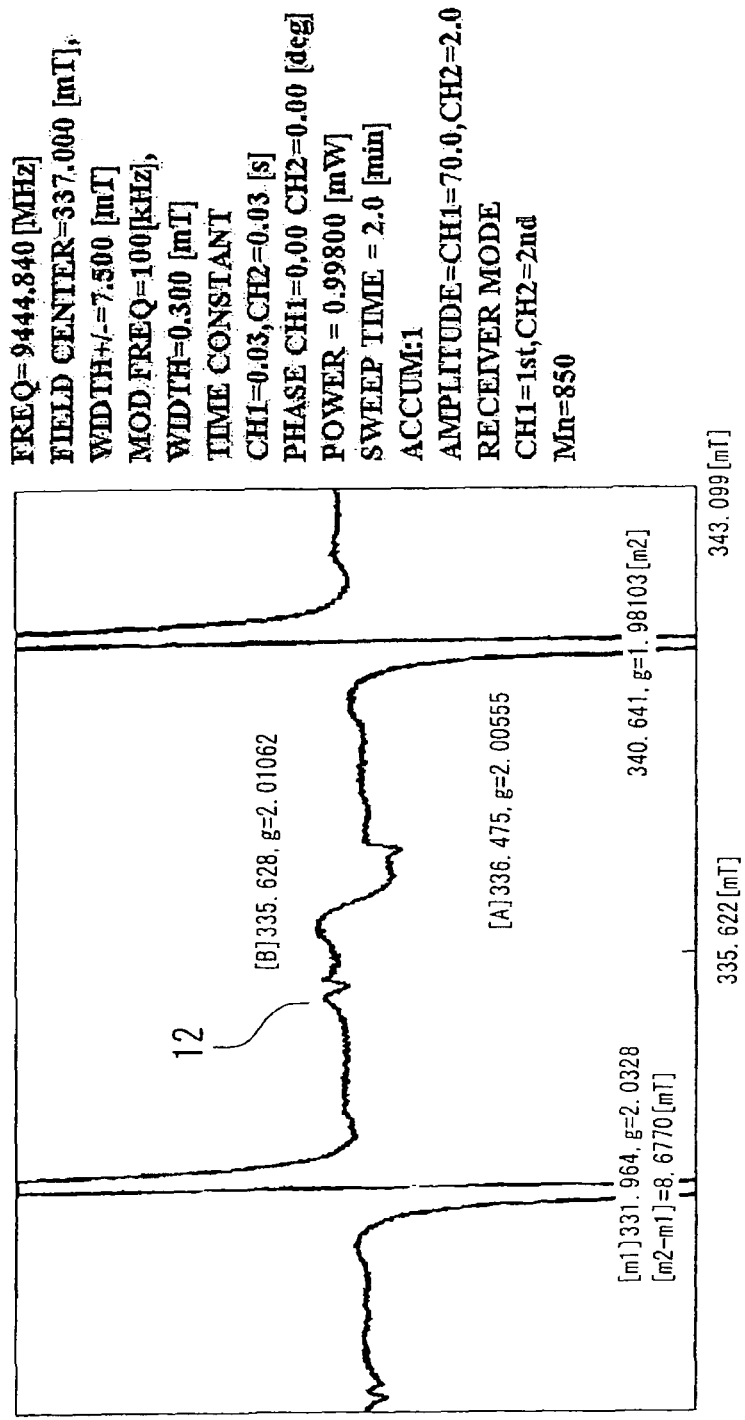
[FIG. 10]

[FIG. 11]
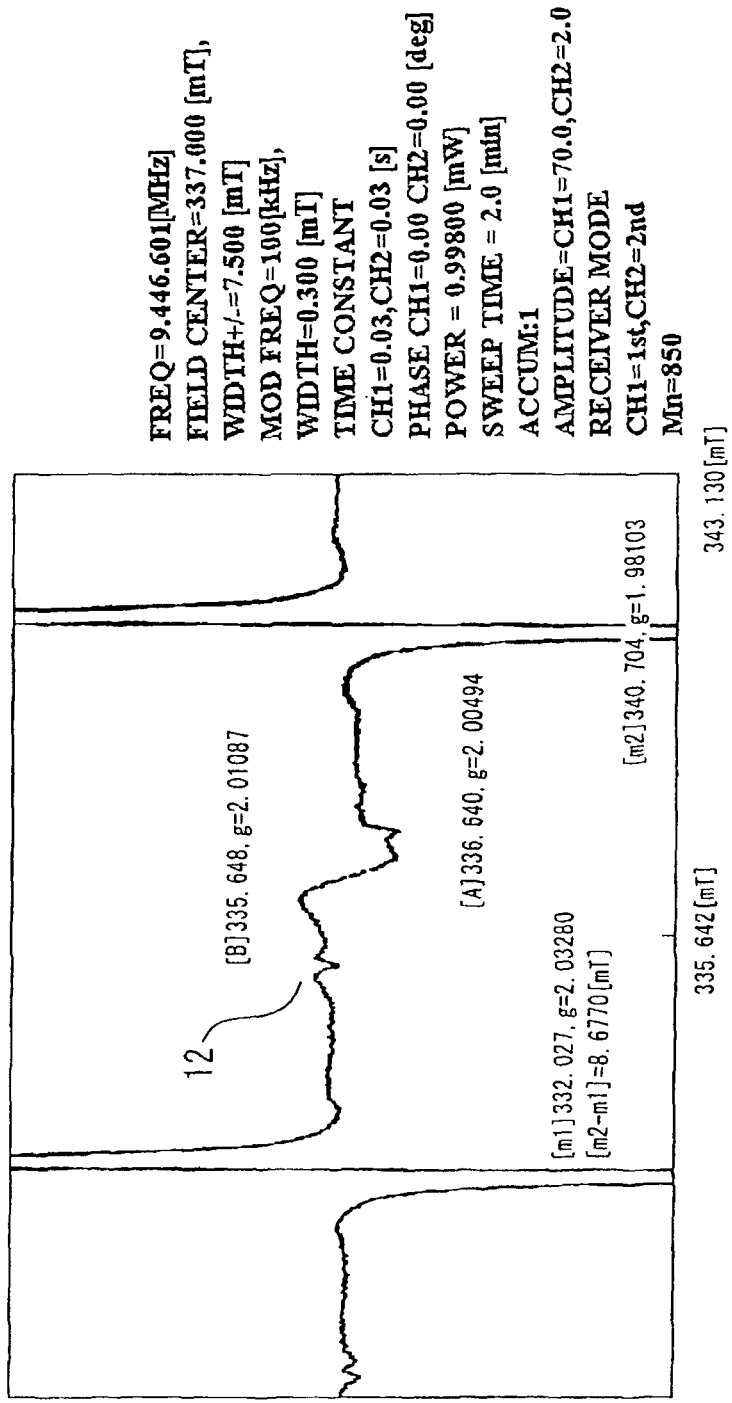

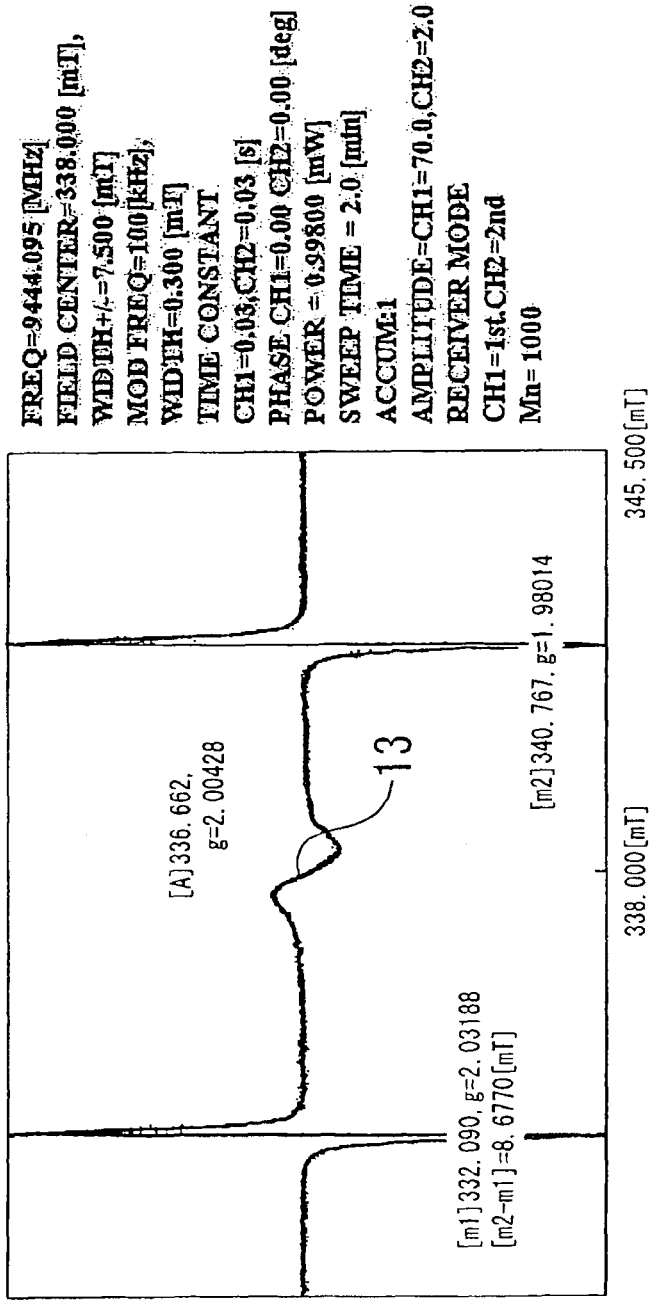
[FIG. 12]

METHOD FOR FORMING BOND BETWEEN DIFFERENT ELEMENTS

This is a Division of application Ser. No. 13/518,712 filed Jun. 22, 2012, which in turn is a National Stage application of PCT/JP2010/073255 filed Dec. 23, 2010, which claims the benefit of Japanese Patent Application No 2009-292300 filed Dec. 23, 2009. The disclosure of the prior applications is hereby incorporated by reference herein in its entirety.

TECHNICAL FIELD

The present invention relates to a technique for forming a bond between different metals using low-temperature atmospheric-pressure plasma jet and, in particular, relates to a technique useful for doping with a Group 13 element or a Group 15 element into a silicon film using a polysilane compound and an oligosilane compound that can form a film through coating.

BACKGROUND ART

A silicon semiconductor is a material that has been studied as materials for a thin film transistor (TFT) and a solar cell since a long time ago. In particular, the TFT has been studied for a long time. In 1930, Lilienfeld et al. developed it as a current control device, and then in 1945, a vacuum deposited silicon thin film was observed to have a slight TFT action. Bardeen et al. examined the characteristic evaluation to lead to a suggestion in which an electric field to a semiconductor surface due to a gate potential is shielded by surface level, causing surface carriers not to be substantially changed (Bardeen's model). Based on the model, a point-contact transistor (1947) and a junction transistor (1948) that act as a transistor by injection of a minority carrier into a bulk crystal were developed. In 1950, a bipolar transistor was actively studied, and various inexpensive discrete elements have become popular to take the place of a vacuum tube.

However, at that time, a silicon TFT exhibited no characteristic, and compound semiconductors such as CdS were used, but the characteristics of such semiconductors were not stabilized at all. Then, RCA improved the characteristics and developed a TFT using a CdS thin film exhibiting fine characteristics in 1962. Furthermore, from 1960 to 1970, Westinghouse produced operative TFTs on Mylar (polyethylene terephthalate), Kapton (polyimide), and paper that are precursors of a flexible display. Up to then, II to VI compound semiconductors, tellurium (Te), and the like had been used as semiconductor materials. CdSe as a compound semiconductor readily forms a polycrystalline structure through a low temperature process such as deposition, can achieve a hole electron mobility of about 50 $cm^2/Vs$ and has characteristics of a high ion current and a low off-state current, and consequently has been used as a TFT material. However, it is a two-dimensional compound semiconductor. This raises an intrinsic problem of stoichiometry and a problem of unstable transistor characteristics due to the contact condition between a gate insulating film and a CdSe interface.

To address this, in 1975, Prof. Spear et al. at Dundee University in the UK successfully developed a hydrogenated amorphous silicon (a-Si:H) thin film that exhibits good semiconductor characteristics by glow discharge. Good TFT characteristics using the thin film were reported in 1979, and then the TFT material has shifted to silicon at once. The (a-Si:H) TFT has a small off-state current and can ensure a high on/off current ratio but is considered to have a disadvantage of a low mobility. In contrast, it has been pointed out that a thin film of silicon deposited at a high temperature or a poly-Si TFT composed of a (poly-Si) thin film that is obtained by heating of an (a-Si:H) thin film has a high mobility but a large off-state current. However, the silicon has finally been selected as the TFT material from the viewpoints of low cost, operability, and performance.

The (a-Si:H) film is excellent in uniformity, reproducibility, and microfabrication properties of the film in the formation of a thin film having a large area and is a material suited for a device having a large area. The a-Si (amorphous silicon) can be treated at a comparatively low temperature. The obtained TFT is a highly resistant material and can work with low voltage alternating-current. Hence, such a TFT is used as a basic switch element for picture elements of LCDs. As a preparation method of a commonly used amorphous silicon thin film, a plasma CVD method, a photo-CVD method, a thermal CVD method, and a reactive sputtering method are known.

There is a production method that includes forming an electron flow from a negative electrode to a positive electrode through a minute substance, inducing plasma on a surface of the minute substance based on the potential difference, and producing a reaction substance by a plasma reaction (see Patent Document 1).

There is a method for forming a thin film that includes introducing a reaction gas that is to be a material of a thin film into a reaction furnace, applying a voltage between electrodes to form plasma and decompose the reaction gas, and causing a chemical reaction to deposit a thin film on a substrate (see Patent Document 2).

In the plasma CVD method, electric energy is applied to a Si-containing material gas such as silane gas ($SiH_4$) to generate plasma, and active radicals or ions are generated to cause a chemical reaction in an active environment.

The generated plasma has two temperatures of an electron temperature and a gas temperature. There are a high temperature plasma having high electron and gas temperatures reaching several tens of thousands Kelvin and a low temperature plasma having a high electron temperature reaching several tens of thousands Kelvin and a low gas temperature ranging from room temperature to hundreds of degree Celsius. In particular, the used of the low temperature plasma enables the formation of a thin film while maintaining a substrate temperature at a low temperature. In contrast to the conventional thermal CVD method in which the temperature of a substrate must be raised to about 1,000° C., the plasma CVD method has an advantage of being capable of forming a thin film while maintaining a substrate at a low temperature.

The formed active species reaches a substrate surface mainly due to diffusion, and undergoes processes such as adsorption, desorption, drawing, insertion, and surface diffusion on the surface to form a film as an a-Si thin film. The electric power used for generating plasma is a direct current, a radio wave, a high-frequency wave, a microwave, and the like. Among them, a high-frequency wave in a frequency band of 13.56 MHz is typically used. In an actual plasma reaction apparatus, electrodes are disposed opposite to each other in a vacuum chamber. The high-voltage electrode is connected to a high-frequency power supply through a dielectric material and the like to form a cathode. The other electrode is grounded together with the vacuum chamber to form an anode. Almost all the high-frequency electric power charged is consumed near the cathode. Thus, in such region, $SiH_4$ is actively excited and decomposed. In addition, the thin film deposition rate is larger on the cathode side. However, the film is formed in a large electric field, the electrode surface is accordingly subjected to a strong impact of positive ions, and it is very difficult to obtain a smooth surface. Therefore, a substrate on which a deposition film is formed is typically installed on the anode side. However, it seems to be disadvantageous for the plasma CVD method that the substrate is affected by the ion impact even in such installation manner. This impact effect is more remarkable when the pressure is lower and when the charged electric power is higher.

With respect to the film growth, the generated active species come into collision in $SiH_4$ gas to be deactivated. However, among them, $SiH_3$ is stable against the deactivation by the collision. In other words, $SiH_3$ has low reactivity, and thus $SiH_3$ alone cannot participate in the formation of a network as long as the growth surface has no dangling bond. Actually, on a substrate having a temperature of 100 to 300° C., it is shown that the surface of a growth film is almost covered with hydrogen. $SiH_3$ that has reached the surface moves to a site from which hydrogen is drawn while diffusing on the surface. When the surface diffusion is active in this manner, Si atoms are arranged in an energetically more stable site to form a dense amorphous film having high relaxivity.

In recent years, new low-defect film preparation techniques have been developed. For example, there are a method in which reaction at a high temperature (350° C. or more) increases the diffusion coefficient of a reaction species and dangling bonds generated by thermal desorption of hydrogen covering a surface are integrated into a film without clearance by supplying a large amount of $SiH_3$, a method in which thermal energy is supplied to a reaction dominating species, and a method in which a growth surface is photoexcited to accelerate surface diffusion. There are also developed a growth/hydrogen plasma treatment repeating method (chemical annealing method) in which an amorphous structure that is present in a several atom layer from a growth surface and that has not been solidified is intended to be relaxed by atomic hydrogen and a method of reducing a thin film growth rate to provide a time needed for relaxation. It has been demonstrated that thin films prepared by the above methods are especially useful as an (a-Si:H) solar cell.

In contrast, in the photo-CVD method, $SiH_4$ is directly (so-called direct photo-CVD) or indirectly (so-called mercury sensitizing or indirect photo-CVD) degraded using light energy, and these methods are collectively called the photo-CVD method. In these growth methods, it is supposed that a growth film surface is not subjected to the impact of ion species and electrons having high energy, and hence mild growth conditions can be obtained. Furthermore, for example, in the mercury sensitizing method, it is considered that a $SiH_3$ reaction species having a large surface diffusion coefficient is selectively generated to achieve conditions suited for the formation of a good film. Generally, a low film formation rate causes a problem, but the use of a high-order silane having a high degradation efficiency, such as $Si_2H_6$ and $Si_3H_8$ in place of $SiH_4$ compensates for the problem.

As doping for such a thin film, a gas phase doping method is commonly performed. The doping can be readily performed by reaction while adding an impurity gas such as $PH_3$, $AsH_3$ (n-type), and $B_2H_6$ (p-type) to a $SiH_4$ source.

By the plasma CVD method and the photo-CVD method as above, an amorphous silicon film can be obtained at a comparatively low temperature (about 300° C.) and the use of $SiH_4$ in combination with another mixing gas enables the reaction of these two or more molecules on a solid phase surface or in a gas phase to form a bond between different elements.

Meanwhile, use of polycrystalline silicon intends to reduce cost by the reduction in cost needed for crystallization which accounts for a large proportion of the raw material cost of single crystalline silicon, and the purity of the raw material and a substrate preparation process including crystallization are improved. As shown in FIG. 1, preparation methods of a polycrystalline silicon wafer are classified into three methods; that is, an ingot slicing method, a sheet method with a substrate, and a sheet method without a substrate. For these three methods, methods shown in FIG. 1 are developed. First, a metallurgical grade silicon (an impurity concentration of about $10^{-2}$) as a raw material includes heavy metals (life time killer) that provide a deep level in a bulk crystal, elements that provide a donor and an acceptor, and a large amount of oxygen and carbon. In semiconductor-grade silicon, impurities are chemically removed or removed by segregation to a level not affecting a product. In contrast, a solar cell is not required to have such a high purity that is required for the semiconductor-grade silicon, because it is a large area single junction device. For example, for a solar cell, the necessary impurity level for achieving a conversion efficiency of about 10% is as shown in Table 1. For the solar cell-grade silicon, acid washing, a method using segregation at the time of crystallization, and the like are considered to be effective. The metallurgical-grade silicon includes carbon that is used in a reduction process of silicon oxide, and hence a decarbonizing process is also important.

TABLE 1

| Impurity | Concentration in metallurgical grade silicon (ppm) | Allowable amount (ppm) |
|---|---|---|
| Dopant | | |
| Al | 1,500 to 4,000 | |
| B | 40 to 80 | |
| P | 20 to 50 | |
| Life time killer | | |
| Ti | 160 to 250 | 0.001 |
| V | 80 to 200 | 0.002 |
| Fe | 2,000 to 3,000 | 0.02 |
| Cr | 50 to 200 | 0.1 |
| Ni | 30 to 90 | 0.8 |

For the preparation of polycrystalline silicon, a crystal grain size is firstly considered. This is because, especially in a solar cell, when the crystal grain size is large as compared with a film thickness, a minority carrier that flows into a junction to effectively contribute to electric power generation is sufficiently larger than the flow into a grain boundary exhibiting a short carrier lifetime, and this can suppress effects on the crystal grain boundary. An actual silicon solar cell needs a crystal grain boundary of 50 μm or more. The crystal grain boundary greatly depends on a production process and a film thickness, and in general, the production process is broadly divided into a liquid phase method and a gas phase method. The methods shown in FIG. 1 correspond to the liquid phase method. The ingot slicing method is a method in which a molten silicon is poured into a mold and cooled to prepare an ingot and the ingot is sliced.

Silso by Wacker and HEM (Heat exchange method) by Crystal System are known, and a crystal grain boundary prepared by the methods reaches several millimeters. Such a liquid phase method needs high temperature treatment because a molten silicon is typically used, and hence the method needs a large system. In contrast, the preparation method from a gas phase includes a vacuum deposition method, a sputtering method, and a gas-phase chemical reaction (CVD) method as described above. However, the crystal grain boundary obtained by such a method is normally very small, and hence the product cannot be used without treatment. Therefore, in order to obtain a crystal having a large grain boundary, it is necessary to subject the gas phase grown crystal to a crystal growth process in a liquid phase state once again, and this needs treatment with electron beam, laser, lamp heating, and the like.

RELATED ART DOCUMENTS

Patent Documents

Patent Document 1: Japanese Patent Application Publication No. JP-A-2005-238204
Patent Document 2: Japanese Patent Application Publication No. JP-A-6-314660

SUMMARY OF THE INVENTION

Problem to be Solved by the Invention

In related arts, for example, for the formation of an amorphous silicon film, silane gas and a dopant gas are mixed in an ultrahigh vacuum chamber and a silicon film is formed on a substrate. However, such a method needs the vacuum chamber, which causes a problem in which a substrate area is limited by the chamber volume.

Furthermore, a dangling bond generated during film formation is bonded to impurity elements during crystal growth to provide an electron state having energy that corresponds to a forbidden band in a single crystalline silicon. This works as a trap site or a recombination center with respect to a minority carrier and usually shortens the service life of a device. In the plasma CVD method and the like, short circuit must be developed using hydrogen with respect to such a dangling bond for inactivation. This operation must be carried out in a CVD system and this also needs an ultrahigh vacuum chamber, which causes a problem in process.

In contrast, in the production of a polycrystalline silicon, as described above, the liquid phase method needs the operation in an environment at high temperature for melting silicon and without oxygen and also needs a reduction operation using carbon for removing oxygen that is contained in the silicon in a large amount. In this manner, the polycrystalline silicon needs huge thermal energy for crystal growth and has a problem in production process.

Furthermore, doping with respect to such a silicon film is carried out in a manner similar to that in the production process of a single crystalline silicon. In contrast, when a polycrystalline silicon is produced by the gas phase method, after the film formation of an amorphous silicon by CVD described above, the amorphous silicon is further heated and melted to make a single crystal. This method also has a problem in which heat treatment that is substantially the same degree as in the liquid phase method is finally required.

The present invention overcomes the above disadvantages and provides a doping technique that forms, at a low temperature, a stable amorphous silicon film and a stable polycrystalline silicon film, and at the same time imparts conductivity in an atmospheric pressure environment.

Means for Solving the Problem

The present invention provides, as a first aspect, a method for producing a compound containing a bond between different elements belonging to Group 4 to Group 15 of the periodic table, the method being characterized by including applying, at a low frequency and atmospheric pressure, high voltage to an inside of an electric discharge tube obtained by attaching high-voltage electrodes to a metal tube or an insulator tube or between two flat plate electrodes provided with high-voltage electrodes while passing an introduction gas, so as to convert molecules present in the electric discharge tube or between the flat plate electrodes into a plasma; and applying the plasma to substances to be irradiated, the substances to be irradiated being two or more elementary substances belonging to Group 4 to Group 15 of the periodic table, two or more compounds containing the element, or a combination of the elementary substance and the compound, as a second aspect, the production method according to the first aspect, in which the compound containing a bond between different elements is a compound containing a bond between different elements belonging to Group 13 to Group 15 of the periodic table, as a third aspect, the production method according to the first aspect or the second aspect, in which the plasma or a radical of a surrounding gas excited by the plasma is applied to the substances to be irradiated and ultraviolet light is also applied to the substances to be irradiated, as a fourth aspect, the production method according to any one of the first aspect to the third aspect, in which the compound containing a bond between different elements is obtained as a coating on a substrate, as a fifth aspect, the production method according to any one of the first aspect to the fourth aspect, in which the substances to be irradiated are two or more substances selected from the group consisting of the elementary substances, the compounds, solutions containing the elementary substances, solutions containing the compounds, gases of the elementary substances, and gases of the compounds, as a sixth aspect, the production method according to any one of the first aspect to the fifth aspect, in which one of the substances to be irradiated is a compound containing a Group 14 element and another is a gas of an elementary substance belonging to Group 4 to Group 15 or a gas of a compound containing the element, as a seventh aspect, the production method according to any one of the first aspect to the sixth aspect, in which one of the substances to be irradiated is a compound containing a Group 14 element, another is an elementary substance belonging to Group 13, a compound containing the element, an elementary substance belonging to Group 15, or a compound containing the element, and the elementary substance belonging to Group 13, the compound containing the element, the elementary substance belonging to Group 15, or the compound containing the element is included in a ratio of 0.2 to 10 mol with respect to 1 mol of the compound containing a Group 14 element, as an eighth aspect, the production method according to the first aspect, in which the compound containing a bond between different elements contains a Si—Si bond and a Si—B bond or a Si—P bond, as a ninth aspect, the production method according to any one of the sixth aspect to the eighth aspect, in which the compound containing a Group 14 element is at least one silane compound selected from the group consisting of a chain silane compound of Formula (1):

$$Si_nH_{2n+2} \quad \text{Formula (1)}$$

(in Formula (1), n is an integer of 2 to 40), a cyclic silane compound of Formula (2):

$$Si_hH_{2h} \quad \text{Formula (2)}$$

(in Formula (2), h is an integer of 3 to 10), a cyclic silane compound of Formula (3):

$$Si_hH_{2h-2} \quad \text{Formula (3)}$$

(in Formula (3), h is an integer of 3 to 10), and a cage silane compound of Formula (4):

$$Si_mH_m \quad \text{Formula (4)}$$

(in Formula (4), m is an integer of 6, 8, or 10), as a tenth aspect, the production method according to any one of the sixth aspect to the eighth aspect, in which the elementary substance belonging to Group 13 or the compound containing the element is an elemental boron or a boron-containing compound of Formula (5):

$$B_iH_j \quad \text{Formula (5)}$$

(where i is an integer of 1 to 10, and j is an integer of 0 to 12), as an eleventh aspect, the production method according to any one of the sixth aspect to the eighth aspect, in which the elementary substance belonging to Group 15 or the compound containing the element is an elemental phosphorus or a phosphorus-containing compound of Formula (6):

$$P_wX_u \quad \text{Formula (6)}$$

(where w is an integer of 1 to 10, u is an integer of 0 to 12, and X is a hydrogen atom or a monovalent organic group), an elemental arsenic, an arsenic-containing compound, a nitrogen molecule, or a nitrogen-containing compound, as a twelfth aspect, the production method according to any one of the first aspect to the eleventh aspect, in which the gas introduced into the electric discharge tube or between the flat plate electrodes is at least one type of gas selected from the group consisting of helium, neon, argon, krypton, xenon, nitrogen molecules, oxygen molecules, hydrogen molecules, carbon dioxide, nitric oxide, nitrogen dioxide, ammonia, halogen molecules, hydrogen halides, sulfur dioxide, hydrogen sulfide, and water vapor, as a thirteenth aspect, the production method according to any one of the first aspect to the eleventh aspect, in which the gas introduced into the electric discharge tube or between the flat plate electrodes is helium gas alone or a mixed gas of helium with at least one type of gas selected from the group consisting of hydrogen molecules, oxygen molecules, nitrogen molecules, carbon dioxide, carbon monoxide, fluorine molecules, and chlorine molecules, as a fourteenth aspect, the production method according to any one of the first aspect to the thirteenth aspect, in which the two flat plate electrodes formed of a metal or an insulator are disposed facing each other, one of the electrodes is connected to a high-voltage electrode, the other is not connected to an earth lead for air discharge or is connected to a grounding electrode, and a gas is passed through between the electrodes so as to convert molecules present between the electrodes into a plasma, as a fifteenth aspect, the production method according to any one of the first aspect to the fourteenth aspect, in which the two flat plate electrodes formed of a metal or an insulator are in a decompressed container, the introduction gas is passed after decompression, and a high voltage is applied at a low gas pressure and a low frequency to convert molecules present between the electrodes into a plasma, as a sixteenth aspect, the production method according to any one of the first aspect to the fifteenth aspect, in which the electric discharge tube formed of a metal tube or each of the flat plate electrodes formed of a metal is formed of an elementary substance belonging to Group 4 to Group 14 or a mixture containing the elementary substance, as a seventeenth aspect, the production method according to any one of the first aspect to the fifteenth aspect, in which the electric discharge tube formed of an insulator tube or each of the flat plate electrodes formed of an insulator is formed of a synthetic polymer, a natural polymer, glass, or ceramic, and as an eighteenth aspect, the production method according to any one of the first aspect to the seventeenth aspect, in which a power supply used for plasma generation has a frequency of 10 Hz to 100 MHz and an output voltage of 1,000 V to 30,000 V and the plasma is applied at a low temperature.

Effect of the Invention

The present invention enables doping that forms a stable amorphous silicon film and a stable polycrystalline silicon film at a low temperature and simultaneously that imparts conductivity in an atmospheric pressure environment.

The present invention relates to a technique for forming a bond between different metals using low-temperature atmospheric-pressure plasma jet, and in particular, relates to a technique useful for doping with a Group 13 element or a Group 15 element into a silicon film using an oligosilane compound that can form a film through coating.

In other words, chemical reaction by plasma is controlled by the control of plasma jet that is in an ionized gas state and has high energy by gas pressure and electric field, and this enables doping of a silicon thin film with a different element near atmospheric pressure and at low temperature.

As a whole, plasma that is at low temperature but has a high energy component with high reactivity and is in a non-equilibrium state, is generated at a pressure not less than the steam pressure of a liquid, that is, at a pressure around atmospheric pressure. By application of a mixed solution of a boron hydride compound and an oligosilane compound and subsequent spin coating, a thin film is formed. The plasma is applied to the thin film to remove hydrogen so that silicon and boron are directly bonded. The treatment can be continuously performed because an ambient pressure process using the ambient pressure (atmospheric pressure) plasma does not need vacuum. Furthermore, helium gas that is readily ionized is used for plasma generation. In addition, the treatment can be performed at a low temperature, and hence the treatment can be performed without damage to a substrate. Therefore, the technique can be applied to various substrates. The technique is used for producing a solar cell, a transistor, and various sensors including a silicon semiconductor as a basic component in an atmospheric pressure environment through a low temperature wet process. The technique enables the formation in a low temperature process. Therefore, the technique is useful for weight reduction of devices and useful as a technique for production of plastic devices.

BRIEF DESCRIPTION OF THE DRAWINGS

FIG. 1 is a view showing types of the preparation method of a polycrystalline silicon.

FIG. 2 is a schematic view showing a thermal non-equilibrium atmospheric-pressure plasma jet apparatus.

FIG. 3 is a view showing emission spectra from plasma.

FIG. 4 is a schematic view showing a thermal non-equilibrium atmospheric-pressure plasma apparatus using flat plate electrodes.

FIG. 5 is a view showing the results of XPS analysis of a Si—N bond formed by doping of an oligosilane with nitrogen.

FIG. 6 is a view showing the results of XPS analysis of a Si—B bond formed by doping of an oligosilane with boron.

FIG. 7 is a view showing voltage-current characteristics of a boron-doped amorphous silicon.

FIG. 8 is a view showing an ESR spectrum showing a hole generated in a valence band derived from boron by plasma exposure.

FIG. 9 is a view showing an ESR spectrum showing a hole generated in a valence band derived from boron by plasma exposure.

FIG. 10 is a view showing an ESR spectrum showing a hole generated in a valence band derived from boron by plasma exposure.

FIG. 11 is a view showing an ESR spectrum showing a hole generated in a valence band derived from boron by plasma exposure.

FIG. 12 is a view showing an ESR spectrum showing an electron generated near a conductor derived from phosphorus by plasma exposure.

MODES FOR CARRYING OUT THE INVENTION

The present invention is a method for producing a compound containing a bond between different elements belonging to Group 4 to Group 15 of the periodic table. The compound is obtained by applying, at a low frequency and a pressure near atmospheric pressure, high voltage to an inside of an electric discharge tube that is obtained by attaching high-voltage electrodes to a metal tube or an insulator tube or between two flat plate electrodes provided with high-voltage electrodes while passing an introduction gas, so as to convert molecules present in the electric discharge tube or between the flat plate electrodes into a plasma (see FIG. 2 and FIG. 4), and applying the plasma to two or more elementary substances belonging to Group 4 to Group 15 of the periodic table or compounds containing the element.

The application of the plasma (ionized substance) and radicals of a surrounding gas excited by the plasma to metals, elements to be a semiconductor, or compounds of them achieves the production of the compound containing a bond between different elements.

The compound containing a bond between different elements contains a bond between different elements between Group 4 elements and Group 15 elements of the periodic table and in particular, contains a bond between different elements between Group 13 elements to Group 15 elements of the periodic table. Containing a bond between different elements means being composed of a bond between the same elements and a bond between different elements. In a compound containing a bond between different elements, a Group 14 element doped with a Group 13 element has a ratio (Group 13 element)/(Group 14 element) ranging from $1\times10^{-1}$ to $1\times10^{-6}$ and includes hydrogen in a total amount of about 15% by atom to 25% by atom, while a Group 14 element doped with a Group 15 element has a ratio (Group 15 element)/(Group 14 element) ranging from $1\times10^{-2}$ to $1\times10^{-5}$ and includes hydrogen in a total amount of about 15% by atom.

In particular, the compound containing a bond between different elements may contain a Si—Si bond in combination with a Si—B bond or a Si—P bond. Each doping amount of boron and phosphorus is not limited, but the amount of hydrogen in a p-type a-Si:H film doped with boron can be determined by a hydrogen heat release method and an infrared absorption method (Z. E. Smith, Glow-discharge Hydrogenated Amorphous Silicon, KTK/Kluwer, Tokyo, Boston, 1989, 127). The hydrogen heat release spectrum reveals that (B)/(Si) is in a range of $1\times10^{-1}$ to $1\times10^{-6}$ and the total hydrogen amount is about 15% by atom to 25% by atom. Phosphorus can be analyzed in a similar method and the measurement reveals that (P)/(Si) is in a range of $1\times10^{-2}$ to $1\times10^{-5}$ and the total hydrogen amount is about 15% by atom.

The atmospheric pressure is a pressure in an environment where plasma is generated, and is not particularly limited but, for example, is in a range not less than the steam pressure of a solution and 10 atmosphere or less, and more preferably an atmospheric pressure where a reaction is carried out without pressure, and the atmospheric pressure is preferred because such an environment does not need a decompressor and a compressor.

The compound containing a bond between different elements can be obtained as a coating on a substrate by applying two or more elementary substances or compounds of them as substances to be irradiated on the substrate and applying plasma to the substances.

The substances to be irradiated can be used in a form of the elementary substance itself, the compound itself, a solution containing them, a gas of the elementary substance, a gas of the compound, or a combination of some of them.

For the substances to be irradiated, a compound containing a Group 14 element may be used as one of the substances, and a gas may be used as the other.

In addition, for the substances to be irradiated, an elementary substance belonging to Group 14 or a compound containing the element may be used as one of the substances, and an elementary substance belonging to Group 13 or Group 15 or a compound containing the element may be used as the other. The elementary substance belonging to Group 13 or Group 15 or the compound containing the element may be used as a gas.

As the compound containing a Group 14 element, at least one silane compound selected from the group consisting of Formula (1), Formula (2), Formula (3), and Formula (4) may be used.

Formula (1) represents a chain silane compound (including linear and branched silane compounds), and n is an integer of 2 to 40 or an integer of 2 to 30. Formula (2) and Formula (3) represent cyclic silane compounds, and h is an integer of 3 to 10. Formula (4) represents a cage silane compound, and m is 6, 8, or 10.

The silane compound can be obtained, for example, by the following reaction as an example.

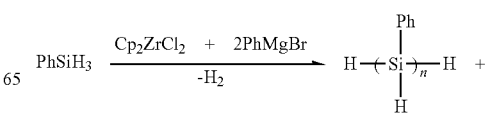

-continued

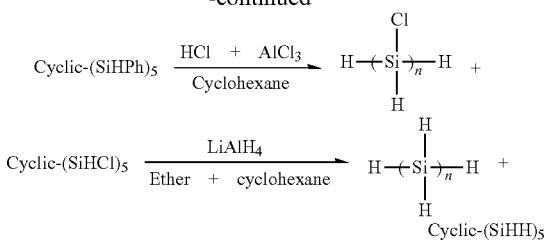

Cp is a cyclopentadienyl group, and Ph is a phenyl group. The silane compound can also be obtained by the following reaction as an alternative method.

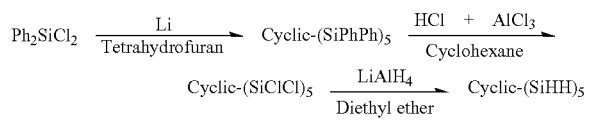

where Ph is a phenyl group.

As the elementary substance belonging to Group 13 or the compound containing the element, Formula (5) can be exemplified.

A boron component can be exemplified by Formula (5) where i is an integer of 1 to 10 and j is an integer of 0 to 12. When j is zero, it is an elemental boron. When j is 1 to 12, it is a boron hydride (borane). Examples of the boron hydride include monoborane ($BH_3$), diborane ($B_2H_6$), tetraborane ($B_4H_{10}$), and decaborane ($B_{10}H_{14}$).

In addition, as the elementary substance belonging to Group 13 or the compound containing the element, gallium, indium, and compounds of them can be used.

As the elementary substance belonging to Group 15 or the compound containing the element, Formula (6) can be exemplified.

An elemental phosphorus or a phosphorus-containing compound can be exemplified by Formula (6) where w is an integer of 1 to 10 and u is an integer of 0 to 12. When u is zero, it is an elemental phosphorus. When u is 1 to 12, it is a phosphorus hydride. Examples of the elemental phosphorus include white phosphorus, red phosphorus, yellow phosphorus, and black phosphorus, and examples of the compound include phosphine ($PH_3$).

In addition, as the elementary substance belonging to Group 15 or the compound containing the element, nitrogen gas, a nitrogen-containing compound, arsenic, and an arsenic-containing compound can be used. Examples of the nitrogen-containing compound include an amine, nitric acid, and a diazo compound. Examples of the arsenic-containing compound include arsenic hydride.

The elementary substance belonging to Group 13, the compound of the element, the elementary substance belonging to Group 15, or the compound of the element may be used in a ratio of 0.2 to 10 mol and preferably 1 to 5 mol with respect to 1 mol of the compound containing a Group 14 element.

A plasma is generated in an electric discharge tube by applying, at a low frequency and a pressure of atmospheric pressure (near atmospheric pressure), high voltage to the electric discharge tube that is obtained by attaching high-voltage electrodes to a metal tube or an insulator tube while passing a gas through the electric discharge tube (FIG. 2a). The generated plasma is applied to a metal, a compound that is to be a semiconductor, or a solution of them, so as to achieve the formation of a metal thin film.

When a metal tube is used as the electrode, the high-voltage electrode alone is connected to the metal tube and grounding is air (FIG. 2b). When a plastic tube is used, earth leads may be attached to front and back of the high-voltage electrode (at positions not being in contact with each other and keeping a distance from each other not causing arc discharge), and grounding may be air as with the metal tube. As the power supply needed for plasma generation, an alternating-current high voltage power supply is used. The alternating-current is 10 Hz to 100 MHz, preferably 50 Hz to 100 kHz, and more preferably 5 kHz to 20 kHz. An alternating voltage in a range of 1,000 V to 30,000 V can generate plasma, but the alternating voltage is preferably 1,000 V to 20,000 V and more preferably 5,000 V to 8,000 V.

A nozzle used for release the plasma is formed of an elementary substance belonging to Group 4 to Group 14 of the periodic table or a mixture containing the elementary substances. To the nozzle, a high-voltage electrode is connected and grounding is air. The application of a high voltage at a low frequency while passing a gas enables the generation of ionized gas and radical gas.

The electrode material is not particularly limited. As a metal, any electric discharge tube of a metal tube having a gas flow path, such as (an) aluminum (tube), (a) stainless steel (tube), (a) copper (tube), (an) iron (tube), and (a) brass (tube) or a metallic electrode can be used.

As the electric discharge tube of an insulator tube or the electrode of an insulator, any plastic may be used. Examples of general-purpose plastics include polyethylene (high-density polyethylene, medium-density polyethylene, and low-density polyethylene), polypropylene, polyvinyl chloride, polyvinylidene chloride, polystyrene, polyvinyl acetate, an acrylonitrile butadiene styrene resin (ABS resin), an acrylonitrile styrene resin (AS resin), an acrylic resin, and polytetrafluoroethylene. Examples of engineering plastics include, but are not necessarily limited to, polyamide, nylon, polyacetal, polycarbonate, modified polyphenylene ether (m-PPE or modified PPE), polybutylene terephthalate, polyethylene terephthalate, a polyethylene terephthalate glass resin (PET-G), cyclic polyolefin, and glass fiber reinforced polyethylene terephthalate (FRP). Examples of super engineering plastics include, but are not necessarily limited to, polyphenylene sulfide, polysulfone, polyethersulfone, amorphous polyarylate, liquid crystal polyester, polyether ether ketone, polyamide imide, polyimide, and polyamide.

In addition to the plastics, an inorganic ceramic material may be used as the insulator tube or the insulator electrode. Specific examples of the inorganic ceramic material include, but are not necessarily limited to, glass, silicon, zirconia, ceramics, alumina, titania, silicon carbide, and silicon nitride.

The plasma generated under the conditions described above is used as a reactive species. As a gas introduced as the plasma generating gas into the electric discharge tube or between the flat plate electrodes, at least one type of gas selected from the group consisting of Group 18 elements (helium, neon, argon, krypton, and xenon), nitrogen, oxygen, hydrogen, carbon dioxide, nitric oxide, nitrogen dioxide, ammonia, halogens, hydrogen halides, sulfur dioxide, hydrogen sulfide, and water vapor may be used. In addition, helium gas alone or a mixed gas of helium with at least one type of gas selected from the group consisting of hydrogen, oxygen, nitrogen, carbon dioxide gas, carbon monoxide, fluorine, and chlorine may be used. The mixed gas may include at least one type of gas selected from the group consisting of hydrogen, oxygen, nitrogen, carbon dioxide gas, carbon monoxide, fluorine, and chlorine in a ratio of 10 volumes or less, preferably 0.1 volume or less, and more preferably 0.001 volume or less, with respect to 1 volume of helium. The mixed gas is not required to include two components and a mixture of three or more types of gases may be used.

By mixing these types of gases, the states of plasma to be generated and of a radical as the secondary product can be changed, and the changed state can be observed in a plasma emission spectrum. For example, by the introduction of nitrogen, the ionization energy of helium excites the nitrogen molecules, and this enables the extraction of energy corresponding to ultraviolet light (see FIG. 3). It is known that the ultraviolet light cleaves the Si—Si bond in an oligosilane or a polysilane described later to form a ring, and this reaction can be used for the solubility control of a silane compound in a solvent or network formation.

Helium gas readily forms a stable plasma in the atmosphere, and hence is typically used. The flow rate of the gas used is a factor affecting a plasma parameter. The available flow rate is normally in a range of 1 mL/second or more and 1,000 mL/second or less. The available flow rate is preferably 10 mL/second or more and 500 mL/second or less and more preferably 30 mL/second or more and 100 mL/second or less.

$B_2H_6$ or $PH_3$ is introduced into the mixed gas, and exposure of the silane compound thin film is performed while releasing the mixed gas into helium ionized gas, which enables easy doping at atmospheric pressure. The ionization of helium in nitrogen gas generates various radical species and ion species derived from the nitrogen gas. By applying these species to the silane compound thin film, a silicon nitride film can be easily formed.

Meanwhile, without using a mixed gas, a solid at ambient temperature, for example, decaborane is dissolved in the silane compound solution, and the solution is used to prepare a thin film. The application of the thermal non-equilibrium plasma to the thin film enables the formation of a Si—B bond in the Si—Si bonds at a temperature around room temperature. Additional examples of the compound usable as a dopant include, but are not necessarily limited to, yellow phosphorus and red phosphorus.

For synthesizing an alloy with silicon, as a non-limiting example, the silane compound is dissolved in a hydrocarbon solvent, and the solvent is used to form a thin film. The direct application of the plasma to the thin film enables the formation of a Si—C bond. The metal for metalation by reduction using a helium plasma is not particularly limited, but a chloride of gold, platinum, silver, niobium, tantalum, or nickel is dissolved in the silane compound, and the solvent is used to form a thin film. The direct application of the plasma to the thin film enables the formation of a bond between silicon and a different element (for example, gold, platinum, silver, niobium, tantalum, and nickel). In addition, a metallic compound having an organic ligand can be used as a raw material. A central metal atom of a complex that precipitates a metal by reduction includes metals belonging to Group 4 to Group 15 of the periodic table and metallic elements belonging to Group 4 to Group 14 of the periodic table. Preferred examples of the central metal atom include, but are not necessarily limited to, gold, silver, copper, palladium, rhodium, and gadolinium. In the synthesis of metal particles using such a metal complex, the use of two or more complexes or the use of a mixture of a plasma gas with a gas other than helium enables the synthesis of particles of a compound such as a metal oxide and a metal nitride. Examples of the organic complex include, but are not necessarily limited to, a carbonyl ligand, a π acid ligand that reduces the electron density of a metal center through a dπ-pπ bond, a carbene ligand, an olefin, and an acetylene ligand. These complexes may be used as a mixture of them.

Two metal flat plate electrodes or two insulator flat plate electrodes are placed facing each other, one is connected to a high-voltage electrode, and the other is not connected to an earth lead for air discharge or connected to a grounding electrode. Gas is passed between the electrodes for using a plasma.

Two metal flat plate electrodes or two insulator flat plate electrodes are in a decompressed container, an introduction gas is passed after decompression, and a high voltage is applied at a low gas pressure and a low frequency to convert the introduction gas into a plasma for use.

The plasma exposure device is not necessarily a plasma jet system emitting from a pencil nozzle. An alternating-current electric field is applied to two opposite flat plate electrodes, and a gas (as a non-limiting example, helium gas) capable of forming a plasma gas is passed through a space between the electrodes to generate a stable atmospheric pressure plasma. A substrate to be treated is placed in the space so that the substrate can be treated (FIG. 4). In a similar manner to that for the treatment using plasma jet described above, $B_2H_6$ or $PH_3$ is introduced into the mixed gas, and exposure of the silane compound thin film is performed while releasing the mixed gas into helium ionized gas, which enables easy doping at atmospheric pressure. The ionization of helium in nitrogen gas generates various radical species and ion species derived from the nitrogen gas. By applying such species to the silane compound thin film, a silicon nitride film can be easily formed.

The electrode material for the parallel flat plate electrodes is not particularly limited, but a material by which an electric field can be concentrated as much as possible, such as a copper mesh, is preferably used in order to stabilize discharge. This aims at avoiding abnormal discharge from a particular weak point on an electrode surface and is important to maintain stable glow discharge at a pressure near atmospheric pressure.

The polysilane compound and the oligosilane compound synthesized in the present invention are filled with an inert gas and then stored in a cold and dark place. The synthesized compound must be handled in an inert gas atmosphere. In particular, the removal of impurity ions contained in a material is not particularly limited but, for example, distillation or an ion exchange method is typically employed.

The polysilane compound and the oligosilane compound obtained in this manner can be used as neat or in a dissolved state in a solvent. Examples of the solvent include, but are not necessarily limited to, a hydrocarbon solvent such as cyclooctane and cyclohexanone; an aromatic solvent such as benzene; tetrahydrofuran; and dimethyl sulfoxide. The solvent includes a silane compound, for example, in a concentration of 0.1 to 30% by mass or 1 to 20% by mass.

Here, dissolved oxygen and water in a solvent are important and are required to be thoroughly removed. It is preferable that each content of the dissolved oxygen and water be substantially zero, but a solvent containing them in trace amounts can be normally used.

The method for removing dissolved oxygen is not particularly limited, but bubbling of argon gas or nitrogen gas, degassing under reduced pressure, and the like may be employed.

A polysilane solvent or an oligosilane solvent prepared using a solvent from which water and dissolved oxygen are removed can form a thin film on an intended substrate commonly by, for example, spin coating, dipping, ink-jetting, dropping, screen printing, and bar coating, but the method is not necessarily limited to them.

In a conventional method, the polysilane or the oligosilane formed on a substrate as a thin film is commonly baked on a hot plate to be stabilized as an amorphous film. The temperature needed at this time is considered to be about 300° C. The obtained amorphous film is normally just a silicon film and does not exhibit characteristics as a p-type or n-type semiconductor when impurities are not present in the polysilane or the oligosilane. Typically, with respect to the amorphous silicon film, a trivalent or pentavalent element is bonded to silicon to provide a binding defect that generates carriers. This operation is called doping. For the doping of a film that has been converted into an amorphous state in this manner, a large amount of energy is required for ion implantation. Such an operation is typically performed in vacuum or in ultra-high vacuum.

In contrast to such a series of processes conventionally used, in the method of the present invention, an oligosilane or a polysilane is applied to a substrate by spin coating, and then a plasma is applied to the substrate after preheating or directly to convert the silane compound into an amorphous silicon. This method does not particularly need high temperature, and hence is a very useful technique for producing plastic devices that are formed using silicon.

In other words, thermoelectrons of the thermal non-equilibrium atmospheric pressure plasma or ion or radical species included in the plasma cleave the Si—H bond of an oligosilane to form a Si—Si bond. In particular, a dielectric barrier plasma has an even lower plasma density, and consequently, the gas temperature is substantially room temperature. However, the electron temperature reaches several tens of thousands Kelvin to several million Kelvin and therefore the plasma can be used for such a reaction.

The method for forming an amorphous silicon using the oligosilane or the polysilane is not particularly limited. For example, the amorphous silicon can be formed by directly applying the plasma to an oligosilane-coated film or a polysilane-coated film, and alternatively, can be formed by removing a solvent through treatment such as heating (for example, 50° C. to 300° C.) followed by applying the plasma.

In particular, when the plasma is applied to a coating in which a solvent remains, a decomposed component of the solvent is bonded to silicon to form a Si—C bond. Accordingly, when a silicon carbide film is needed, the plasma is rather required to be applied to a solvent-remaining surface. In contrast, when a film must not include the Si—C bond, a solvent remaining in a coating is required to be removed in advance. Typically, a solvent having a low boiling point is removed by heating using a hot plate or the like. The application of the plasma to the oligosilane or polysilane film from which a remaining solvent is removed enables the formation of an amorphous silicon film. At this time, the thin film is treated with adequate heat having a temperature that is necessary for volatilization of the solvent.

The impurity doping method of the amorphous silicon film formed as above is not particularly limited. For example, for doping with a trivalent element, a boron compound such as decaborane is dissolved in the oligosilane solvent or the polysilane solvent, the mixture is applied onto a substrate to form a thin film, the plasma is applied to the thin film directly or after solvent removal, and consequently plasma particles or ions and radicals contained in the plasma cleave a B—H bond and a Si—H bond to form a Si—Si bond together with a Si—B bond. Accordingly, the amorphous silicon film is doped with boron. For doping with a pentavalent element, in a similar manner to that for decaborane, a phosphorus compound such as red phosphorus and yellow phosphorus is dissolved in the oligosilane solvent or the polysilane solvent, the mixture is applied onto a substrate to form a thin film, the plasma is applied to the thin film directly or after solvent removal, and consequently plasma particles or ions and radicals contained in the plasma cleave a P—H bond and a Si—H bond to form a Si—Si bond together with a Si—P bond.

Each doped amorphous silicon obtained in this manner is ascertained to function as an n-type semiconductor or a p-type semiconductor.

Each formation of the Si—B bond and the Si—P bond can be easily analyzed by X-ray photoelectron spectroscopy. By using the technique, each formation of the Si—B bond and the Si—P bond was ascertained.

As for the operability of such an oligosilane, there seems to be an effect in which ultraviolet exposure cleaves a Si—Si bond to form a cyclic compound and the formed cyclic silane readily forms a Si—Si bond. The plasma used in the present invention generates ultraviolet light having various wavelengths from radicals and ions derived from nitrogen gas in a nitrogen atmosphere (FIG. 3). This reveals that ultraviolet exposure and amorphous formation that have been performed in a batch process can be simultaneously performed by plasma exposure alone.

In the present invention, the plasma or a radical of a surrounding gas excited by the plasma is applied and ultraviolet light can be further applied. The usable ultraviolet light has a wavelength ranging from 200 to 450 nm.

For the synthesis and the surface treatment of an amorphous silicon semiconductor thin film, the present invention provides a technique capable of forming a semiconductor film through a treatment at a low temperature without high temperature that is required for a conventional method, and the technique is very useful for producing a plastic semiconductor device.

EXAMPLES

Hereinafter, the present invention will be specifically described in detail with reference to examples, but the present invention is not limited to them.

[Synthesis Example 1] Synthesis of Catalyst, Diphenyl Dicyclopentadienyl Zirconium $Cp_2ZrPh_2$ In a nitrogen atmosphere, into a 300-mL reaction flask, dichloro dicyclopentadienyl zirconium $Cp_2ZrCl_2$ (5.0 g) and 39 mL of DME (1,2-dimethoxyethane) as a solvent were charged, and the temperature of the mixture was set to 0 to 10° C. To the mixture, 34.37 mL of solution of phenylmagnesium bromide (PhMgBr) in THF (tetrahydrofuran) having a concentration of 37.1 mol/L was added dropwise at the same temperature, and the whole was stirred at 24 to 26° C. for 19 hours. The reaction mixture was concentrated under reduced pressure at 20° C./20 Torr, then 8 mL of diethyl ether ($Et_2O$) was added, and the whole was stirred at 24 to 26° C. for 1 hour. To the resultant mixture, 39 mL of toluene was further added, then the whole was stirred at the same temperature for 30 minutes, and the reaction solution was filtered. The filtrate was concentrated under reduced pressure at 20° C./10 Torr, and the obtained solid was washed with 60 mL of diethyl ether (Et$_2$O) followed by drying under reduced pressure at 20° C./5 Torr to yield a target catalyst, diphenyl dicyclopentadienyl zirconium Cp$_2$ZrPh$_2$ (5.53 g).

[Synthesis Example 2] Synthesis of Polyphenylsilane

In a nitrogen atmosphere, into a 100-mL reaction flask, diphenyl dicyclopentadienyl zirconium Cp$_2$ZrPh$_2$ (0.165 g) synthesized in Synthesis Example 1 was charged as a catalyst, then phenylsilane PhSiH$_3$ (10 g) was added to the catalyst at 24 to 26° C., and the mixture was stirred at the same temperature for 89 hours. To the resultant mixture, toluene (47 g) was added, then 3% HCl (68 g×5 times) was added, and the whole was stirred and washed. The organic phase was separated, then ion-exchanged water (68 g) was added, and the whole was stirred and washed. The organic phase was purified by Florisil (27 g) column chromatography using toluene (118 g) as an eluant followed by concentration, and the product was dried at 80° C. for 2 hours to yield polyphenylsilane (8.87 g) as a target compound. The obtained polyphenylsilane was composed of a chain polyphenylsilane corresponding to Formula (1) and a cyclic polyphenylsilane corresponding to Formula (2) in a molar ratio 59:41. The chain polyphenylsilane had a number average molecular weight of 1,481, a weight average molecular weight of 1,771, and a degree of polymerization of 14. The cyclic polyphenylsilane had a number average molecular weight of 631, a weight average molecular weight of 644, and a degree of polymerization of 5 to 6.

[Synthesis Example 3] Synthesis of Polyhydrosilane

To a 100-mL brown reaction flask, polyphenylsilane (5.0 g) synthesized in Synthesis Example 2 and cyclohexane (43.5 g) as a solvent were charged. To the mixture, aluminum chloride AlCl$_3$ (0.41 g) was added, and the whole was solidified with liquid nitrogen. The temperature of the mixture was raised to room temperature in a water bath followed by nitrogen substitution. Into the mixture, hydrochloric acid HCl gas was blown at a flow rate of 950 mL/min for 10 hours. Then, decompression and pressure return by nitrogen were repeated 10 times to remove hydrochloric acid HCl. To the mixture, 13.72 g of solution containing lithium aluminum hydride LiAlH$_4$ (1.17 g) in diethyl ether (Et$_2$O) was added dropwise at 0 to 10° C. over 30 minutes in a nitrogen atmosphere. The whole was stirred at room temperature for 12 hours, and the reaction solution was poured into ion-exchanged water (11 g). The mixture was stirred for 1 minute and left. Then, the supernatant liquid was decanted. The water washing operation was repeated three times, and then the organic phase was filtered through a membrane filter. The filtrate was concentrated and dried under reduced pressure to yield polyhydrosilane (0.94 g) as a target compound.

Example 1

Doping of Oligosilane with Nitrogen:

Onto a silicon wafer, 10 μL of solution of polyhydrosilane (10% by mass) obtained in Synthesis Example 3 in cyclopentadiene was applied by spin coating (1,500 rpm, 10 seconds) to form a thin film. To the obtained thin film, immediately after the spin coating, plasma was applied for doping with nitrogen. After the completion of doping, the substrate was not fully baked and evaluated as the intended nitrogen-doped amorphous silicon film. The conditions for plasma exposure were as follows: in a glove box filled with nitrogen gas, helium gas having a purity of 99.99% was passed through a glass electric discharge tube having an inner diameter of 2 mm and an outer diameter of 3 mm at 60 liter/minute, and electrical voltage at 10 kV and a frequency of 10 kHz was applied.

Study of Plasma Exposure Conditions for Doping of Polyhydrosilane Obtained in Synthesis Example 3 with Nitrogen:

The substrate coated under the above conditions was baked under the following conditions, and then was exposed to plasma for 5 minutes to be doped with nitrogen. After the doping, the substrate was not fully baked. The conditions for doping treatment with nitrogen into the thin film using the polyhydrosilane obtained in Synthesis Example 3 are listed in Table 2.

TABLE 2

| Pretreatment temperature | Pretreatment time | Baking condition | Plasma exposure time |
|---|---|---|---|
| 200° C. | 5 seconds | Nitrogen | 5 minutes |
| 120° C. | 5 minutes | Nitrogen | 5 minutes |
| 200° C. | 5 minutes | Nitrogen | 5 minutes |
| 250° C. | 5 minutes | Nitrogen | 5 minutes |
| 300° C. | 5 minutes | Nitrogen | 5 minutes |
| 300° C. | 1 hour | Nitrogen | 5 minutes |

The surface of the substrate doped with nitrogen by each treatment method was analyzed by XPS to analyze the binding state near the surface. Each analysis result of nitrogen, oxygen, carbon, and silicon near the surface is shown in FIG. 5.

FIG. 5 reveals that the amount of nitrogen present on the surface depends on the baking temperature and the plasma exposure conditions and in particular, nitrogen is detected at a very high ratio from the film treated with heat at 200° C. for 5 seconds followed by plasma exposure.

Example 2

Study of Plasma Exposure Conditions for Doping of Polyhydrosilane Obtained in Synthesis Example 3 with Boron Atom:

Using decaborane as a boron source, in 0.9 g of solution of decaborane (10% by mass) in cyclooctane, 0.1 g of polyhydrosilane obtained in Synthesis Example 3 was dissolved (it should be noted that decaborane is difficult to be dissolved in a 10% by mass solution of polyhydrosilane). In a glove box, the polyhydrosilane solution in which decaborane was dissolved with stirring was applied onto a silicon wafer under the conditions below.

Condition 1: immediately after the application of the polyhydrosilane (containing decaborane) obtained in Synthesis Example 3, the substrate was exposed to plasma (for 3 minutes), then was heated at 100° C. for 10 minutes, and further heated at 300° C. for 1 hour.

Condition 2: after the application of the polyhydrosilane (containing decaborane) obtained in Synthesis Example 3, the substrate was baked at 130° C. for 10 minutes, then was exposed to plasma for 3 minutes, and was heated at 300° C. for 1 hour.

Condition 3: after the application of the polyhydrosilane (containing twice the volume of decaborane) obtained in Synthesis Example 3, the substrate was baked at 130° C. for 10 minutes, and then heated at 300° C. for 1 hour.

Condition 4: after the application of the polyhydrosilane (containing twice the volume of decaborane) obtained in Synthesis Example 3, the substrate was baked at 130° C. for 5 minutes, then was exposed to plasma for 3 minutes, and was heated at 300° C. for 1 hour.

The conditions for plasma exposure were as follows: helium gas having a purity of 99.99% was passed through a glass electric discharge tube having an inner diameter of 2 mm and an outer diameter of 3 mm at 60 liter/minute; a glove box was filled with helium; and electrical voltage at 10 kHz and a frequency of 10 kV was applied.

The polyhydrosilane solution containing decaborane was applied onto a silicon substrate. The substrates prepared under various conditions were analyzed by XPS and the states of the element contained were observed. The analyzed elements were carbon, nitrogen, oxygen, silicon, and boron, and each element was analyzed at three points. The results are shown in FIG. 6.

From the substrate on which a thin film was formed from the polyhydrosilane containing decaborane by spin coating followed by baking and that was not exposed to plasma, no nitrogen and no boron were detected at all (condition 3). As for the doping with boron, when the substrate was exposed to plasma immediately after the application (condition 1), even from the thin film that was finally fully baked at 300° C., boron was detected. This suggests the possibility of doping into the silicon film. When the substrate was pre-baked at 130° C. as in the conditions 2 and 4, decaborane was contained at a higher ratio under the condition 4, as for the doping concentration; however, boron was contained in the film at a lower ratio. Hence, stable doping could not be performed. Decaborane has a melting point of 99.6° C. and a boiling point of 213° C. but has a low ignition temperature of 149° C., and thus the pre-baking at 130° C. may cause degradation. Therefore, it is supposed that such degradation affected the doping. The element ratio in the film doped with boron under each condition is shown in FIG. 6. The presence of boron was ascertained in each film prepared under the conditions 1, 2, and 4.

Example 3

Electric Characteristic Evaluation of Film Doped with Boron:

To a platinum comb-shaped electrode (L/S=10/10, quartz substrate), the polyhydrosilane obtained in Synthesis Example 3 was applied by spin coating, and the obtained thin film was treated under each of the conditions 1, 2, and 4. The voltage-current characteristics of each obtained substrate were evaluated. All measurements were carried out at room temperature. The results are shown in FIG. 7. In FIG. 7, reference numeral 10 shows the voltage-current characteristics of the film obtained under the condition 2, and reference numeral 11 shows the voltage-current characteristics of the film obtained under the condition 1.

As apparent from FIG. 7, comparing the films with and without pre-baking before the plasma baking, the current flowing in a low voltage region through the film that has been pre-baked followed by plasma exposure is larger than that through the film that has been exposed to plasma without pre-baking. However, it is clear that, in a high voltage region, the current flowing through the film that was exposed to plasma without pre-baking is larger than that through the film that has been pre-baked followed by plasma exposure. Analyzing the voltage-current curves, ohmic current flows in a low voltage region. This suggests that an inner carrier controls the current. In other words, the doping with boron is supposed to exert its effect, and the carrier concentration in a bulk crystal is supposed to be higher under the condition 1. However, in a high voltage region, the current value increased proportional to the square of voltage. This suggests that the current is controlled by a space charge. It was ascertained that the doping with boron led to the flow of a large current.

Example 4

Cyclopentasilane was synthesized in accordance with the method shown in paragraph No. 0027. That is, $Ph_2SiCl_2$ was reacted in tetrahydrofuran using metallic Li as a catalyst to produce cyclic-$(SiPhPh)_5$. Here, Ph is a phenyl group. The cyclic-$(SiPhPh)_5$ was reacted in cyclohexane in the presence of $AlCl_3$ at room temperature by blowing HCl gas to produce cyclic-$(SiClCl)_5$, and the cyclic-$(SiClCl)_5$ was reacted with $LiAlH_4$ at 0 to 10° C. in diethyl ether to produce cyclic-$(SiHH)_5$. The cyclopentasilane was polymerized to yield a polymer of cyclopentasilane.

In cyclooctane, 0.05 g of decaborane was dissolved to prepare a solution, and the solution was added to 1 mL of cyclopentasilane polymer for dissolution.

The obtained solution was applied onto a quartz substrate, and plasma was continuously applied to the sample while heating at 100° C. until the solvent was volatilized. The conditions for plasma exposure were as follows: helium gas having a purity of 99.99% was passed through a glass electric discharge tube having an inner diameter of 2 mm and an outer diameter of 3 mm at 60 liter/minute; a glove box was filled with helium; and electrical voltage at 10 kV and a frequency of 10 kHz was applied.

After the plasma exposure, the substrate was baked at 300° C. for 1 hour and then at 450° C. for 1 hour. The obtained silicon film was collected, and radicals in the film were measured by ESR. The result is shown in FIG. 8.

Example 5

The cyclopentasilane polymer that is the same as that in Example 4 was used. In cyclooctane, 0.01 g, 0.025 g, and 0.05 g of decaborane were dissolved to prepare corresponding solutions. Each solution was added to 1 mL of cyclopentasilane polymer for dissolution.

Each of the obtained solutions was applied onto a quartz substrate, and plasma was continuously applied to the sample at room temperature until the solvent was volatilized. The conditions for plasma exposure were as follows: helium gas having a purity of 99.99% was passed through a glass electric discharge tube having an inner diameter of 2 mm and an outer diameter of 3 mm at 60 liter/minute; a glove box was filled with helium; and electrical voltage at 10 kV and a frequency of 10 kHz was applied. After the plasma exposure, each substrate was baked at 150° C. for 1 hour, then the obtained silicon film was collected, and radicals in the film were measured by ESR. The case in which 0.01 g of decaborane was added to 1 mL of cyclopentasilane polymer is shown in FIG. 9; the case in which 0.025 g of decaborane was added to 1 mL of cyclopentasilane polymer is shown in FIG. 10; and the case in which 0.05 g of decaborane was added to 1 mL of cyclopentasilane polymer is shown in FIG. 11.

Example 6

The cyclopentasilane polymer that is the same as that in Example 4 was used. In 1 mL of cyclopentasilane polymer, 0.5 mL of phosphorus doping solution ACCUSPIN P8545 manufactured by Honeywell was added and dissolved. The obtained solution was applied onto a quartz substrate, and plasma was continuously applied to the sample at room temperature until the solvent was volatilized. The conditions for plasma exposure were as follows: helium gas having a purity of 99.99% was passed through a glass electric discharge tube having an inner diameter of 2 mm and an outer diameter of 3 mm at 60 liter/minute; a glove box was filled with helium; and electrical voltage at 10 kV and a frequency of 10 kHz was applied. After the plasma exposure, the substrate was baked at 300° C. for 1 hour, then the obtained silicon film was scraped off to be collected as particles, and radicals in the film were measured by ESR. The result is shown in FIG. 12.

The measurement conditions for ESR measurement were as follows: magnetic field: 337.5±7.5 mT, modulated magnetic field: 0.3 mT, time constant: 0.03 seconds, microwave output power: 1 mW, microwave frequency: around 9.445 GHz, and measurement time: 2 minutes.

INDUSTRIAL APPLICABILITY

The present invention relates to a technique for forming a coating-type amorphous silicon semiconductor film, and the technique is novel and useful for forming an inorganic semiconductor film through low temperature operation. The technique especially has a large advantage for production of a plastic semiconductor device and is widely applicable for weight reduction of electronic equipment in future.

DESCRIPTION OF THE REFERENCE NUMERALS

1. gas flow tube, 1*a*. gas exhaust nozzle, 2. electrode, 3. electrode for plasma generation, 4. voltage application apparatus, 5. non-equilibrium plasma jet, 6. high-frequency power supply, 7. high-voltage electrode, 8. mesh electrode, 9. plasma gas, 10. curve showing voltage-current characteristics of film obtained by applying oligosilane (containing decaborane) to substrate, baking the substrate at 130° C. for 10 minutes, then applying plasma to the substrate for 3 minutes, and heating the substrate at 300° C. for 1 hour, 11. curve showing voltage-current characteristics of film obtained by applying oligosilane (containing decaborane) to a substrate, applying plasma to the substrate (for 3 minutes) immediately after application of oligosilane, then heating the substrate at 100° C. for 10 minutes, and further heating at 300° C. for 1 hour, 12. curve obtained by ESR spectrum measurement showing hole generated in valence band derived from boron by plasma exposure, and 13. curve obtained by ESR spectrum measurement showing electron generated near conductor derived from phosphorus by plasma exposure.

The invention claimed is:

1. A method for producing a compound containing a bond between different elements belonging to Group 4 to Group 15 of the periodic table, the method comprising:

applying, at a frequency and atmospheric pressure, voltage to an inside of an electric discharge tube obtained by attaching electrodes to a metal tube or an insulator tube or between two flat plate electrodes formed of an insulator provided with electrodes while passing an introduction gas, so as to convert molecules present in the electric discharge tube or between the flat plate electrodes into a plasma; and applying the plasma to substances to be irradiated at a pressure of about atmospheric pressure, wherein the substances to be irradiated being two or more elementary substances belonging to Group 4 to Group 15 of the periodic table, two or more compounds containing the element belonging to Group 4 to Group 15, or a combination of the elementary substance belonging to Group 4 to Group 15 and the compound, wherein one of the substances to be irradiated is a compound containing a Group 14 element and another is a gas of an elementary substance belonging to Group 4 to Group 15 or a gas of a compound containing the element belonging to Group 4 to Group 15, or one of the substances to be irradiated is a compound containing a Group 14 element, another is an elementary substance belonging to Group 13, a compound containing the element belonging to Group 13, an elementary substance belonging to Group 15, or a compound containing the element belonging to Group 15, and the elementary substance belonging to Group 13, the compound containing the element belonging to Group 13, the elementary substance belonging to Group 15, or the compound containing the element belonging to Group 15 is included in a ratio of 0.2 to 10 mol with respect to 1 mol of the compound containing a Group 14 element, and the compound containing the Group 14 element is at least one silane compound selected from the group consisting of:

a chain silane compound of Formula (1):

$$Si_nH_{2n+2} \qquad \text{Formula (1)}$$ 

wherein in Formula (1), n is an integer of 2 to 40, a cyclic silane compound of Formula (2):

$$Si_hH_{2h} \qquad \text{Formula (2)}$$ 

wherein in Formula (2), h is an integer of 3 to 10, a cyclic silane compound of Formula (3):

$$Si_hH_{2h-2} \qquad \text{Formula (3)}$$ 

wherein in Formula (3), h is an integer of 3 to 10, and a cage silane compound of Formula (4):

$$Si_mH_m \qquad \text{Formula (4)}$$ 

wherein in Formula (4), m is an integer of 6, 8, or 10, and wherein in a case where the voltage is applied to the inside of the electric discharge tube obtained by the attaching electrodes to the insulator tube, then the insulator tube is formed of a synthetic polymer, a natural polymer, glass, or ceramic, and in a case where the voltage is applied between the two flat plate electrodes formed of an insulator provided with electrodes, then the insulator is formed of a synthetic polymer, a natural polymer, glass, or ceramic, and wherein the compound containing the bond between different elements is obtained as a coating on a substrate.

2. The production method according to claim 1, wherein the compound containing the bond between different elements is a compound containing a bond between different elements belonging to Group 13 to Group 15 of the periodic table.

3. The production method according to claim 1, wherein the plasma or a radical of a surrounding gas excited by the plasma is applied to the substances to be irradiated and ultraviolet light is also applied to the substances to be irradiated.

4. The production method according to claim 1, wherein the compound containing the bond between different elements contains a Si—Si bond and a Si—B bond or a Si—P bond.

5. The production method according to claim 1, wherein the elementary substance belonging to Group 13 or the compound containing the element is an elemental boron or a boron-containing compound of Formula (5):

$$B_iH_j \qquad \text{Formula (5)}$$

wherein i is an integer of 1 to 10, and
j is an integer of 0 to 12.

6. The production method according to claim 1, wherein the elementary substance belonging to Group 15 or the compound containing the element is an elemental phosphorus or a phosphorus-containing compound of Formula (6):

$$P_wX_u \qquad \text{Formula (6)}$$

wherein w is an integer of 1 to 10,
u is an integer of 0 to 12, and
X is a hydrogen atom or a monovalent organic group, an elemental arsenic, an arsenic-containing compound, a nitrogen molecule, or a nitrogen-containing compound.

7. The production method according to claim 1, wherein the introduction is at least one type of gas selected from the group consisting of helium, neon, argon, krypton, xenon, nitrogen molecules, oxygen molecules, hydrogen molecules, carbon dioxide, nitric oxide, nitrogen dioxide, ammonia, halogen molecules, hydrogen halides, sulfur dioxide, hydrogen sulfide, and water vapor.

8. The production method according to claim 1, wherein the introduction gas is helium gas alone or a mixed gas of helium with at least one type of gas selected from the group consisting of hydrogen molecules, oxygen molecules, nitrogen molecules, carbon dioxide, carbon monoxide, fluorine molecules, and chlorine molecules.

9. The production method according to claim 1, wherein the two flat plate electrodes are disposed facing each other, one of the electrodes is connected to a power supply, the other is not connected to an earth lead for air discharge or is connected to a grounding electrode, and a gas is passed through between the electrodes so as to convert molecules present between the electrodes into a plasma.

10. The production method according to claim 1, wherein the two flat plate electrodes are in a container in which the pressure is less than atmospheric pressure, the introduction gas is passed after the pressure is less than atmospheric pressure, and a voltage is applied at atmospheric pressure and a frequency so as to convert molecules present between the electrodes into a plasma.

11. The production method according to claim 1, wherein the electric discharge tube is formed of the metal tube and is formed of an elementary substance belonging to Group 4 to Group 14 or a mixture containing the elementary substance.

12. The production method according to claim 1, wherein a power supply used for plasma generation has a frequency of 10 Hz to 100 MHz and an output voltage of 1,000 V to 30,000 V and the plasma is applied at a temperature.

* * * * *